(12) United States Patent
Rosoli et al.

(10) Patent No.: US 7,521,888 B2
(45) Date of Patent: Apr. 21, 2009

(54) ELECTRIC MOTOR CONTROLLER FOR A DOMESTIC APPLIANCE

(75) Inventors: Jean Marc Rosoli, Thyez (FR); Francois Xardel, Mieussy (FR)

(73) Assignee: Invensys Appliance Controls SA, Cluses (FR)

(*) Notice: Subject to any disclaimer, the term of this patent is extended or adjusted under 35 U.S.C. 154(b) by 0 days.

(21) Appl. No.: 11/907,376

(22) Filed: Oct. 11, 2007

(65) Prior Publication Data

US 2008/0036404 A1 Feb. 14, 2008

Related U.S. Application Data

(63) Continuation of application No. 10/583,355, filed as application No. PCT/FR2004/003256 on Dec. 16, 2004, now abandoned.

(30) Foreign Application Priority Data

Dec. 18, 2003 (FR) .................................. 03.14889

(51) Int. Cl.
 H02P 3/18 (2006.01)
 H02P 25/14 (2006.01)
 H02P 25/18 (2006.01)
(52) U.S. Cl. ...................... 318/717; 318/244; 318/245; 318/798; 318/799; 318/800; 318/801; 318/802; 318/803; 318/804; 318/805; 388/920; 340/657; 340/309
(58) Field of Classification Search ............... 318/244, 318/245, 737, 798–806, 717, 457; 310/173; 388/920; 340/309, 657
See application file for complete search history.

(56) References Cited

U.S. PATENT DOCUMENTS

| 3,622,853 | A | * | 11/1971 | Eastall ........................ 388/819 |
| 4,113,124 | A | | 9/1978 | Muntjanoff |
| 4,161,679 | A | | 7/1979 | Kohn et al. |
| 4,468,600 | A | | 8/1984 | Barthel et al. |
| 4,558,264 | A | * | 12/1985 | Weischedel ............. 318/400.03 |
| 4,977,394 | A | * | 12/1990 | Manson et al. ............... 340/679 |
| 5,045,988 | A | * | 9/1991 | Gritter et al. .................... 363/35 |
| 5,146,146 | A | * | 9/1992 | Samann ....................... 318/768 |
| 5,150,489 | A | | 9/1992 | Kaji et al. |
| 5,276,939 | A | * | 1/1994 | Uenishi ........................ 15/319 |
| 5,473,229 | A | * | 12/1995 | Archer et al. ........... 318/400.18 |
| 5,557,182 | A | | 9/1996 | Hollenbeck et al. |
| 5,671,135 | A | | 9/1997 | Jorgensen et al. |
| 6,614,197 | B2 | * | 9/2003 | Berringer ..................... 318/245 |

(Continued)

FOREIGN PATENT DOCUMENTS

DE   100 38 475 A1   12/2001

(Continued)

Primary Examiner—Rita Leykin
(74) Attorney, Agent, or Firm—Oliff & Berridge, PLC

(57) ABSTRACT

The invention relates to a three-phase asynchronous electric motor for domestic appliances, comprising power elements, such as triacs or relays, for charge control. The power elements other than the relays are controlled by at least one microcontroller with the aid of an optical insulation means, ensuring electronic programming and also control of the motor with the aid of a command. The microcontroller or microcontrollers are references to a zero potential of a recovery and filter block feeding the motor. The controller can be applied to a washing machine in order to control the electric motor which rotationally drives the drum.

11 Claims, 2 Drawing Sheets

U.S. PATENT DOCUMENTS

| | | | |
|---|---|---|---|
| 6,768,279 B1 * | 7/2004 | Skinner et al. | 318/400.12 |
| 7,000,278 B2 | 2/2006 | Bruntz et al. | |
| 7,146,670 B2 * | 12/2006 | McGill et al. | 8/158 |
| 7,146,749 B2 | 12/2006 | Barron et al. | |
| 2004/0261468 A1 * | 12/2004 | Lueckenbach | 68/12.05 |

FOREIGN PATENT DOCUMENTS

| | | |
|---|---|---|
| EP | 0684 692 A2 | 11/1995 |
| FR | 2 816 724 | 5/2002 |

\* cited by examiner

"ELECTRIC MOTOR CONTROLLER FOR A DOMESTIC APPLIANCE"

This is a Continuation of application Ser. No. 10/583,355 filed Jul. 18, 2006, which in turn is a National Stage Application of PCT/FR2004/003256 filed Dec. 16, 2004. The entire disclosure of the prior applications is hereby incorporated by reference herein in its entirety.

BACKGROUND

The present invention relates to electronic circuits for domestic electrical appliances, the main field of use of the invention being that of washing machines. This invention relates in particular to an electronic card equipped with a controller for three-phase asynchronous motor or a chopper for universal motor.

The types of electric motor recently used in this field, such as three-phase asynchronous motors, require a more complex control than the universal electric motors or single-phase asynchronous motors conventionally used in domestic electrical appliances. Normally, an electronic card separate from that of the programmer is used, dedicated to this new motor control requirement, which raises complex problems of interfacing the two electronic cards and the need to be able to modify and adapt these electronic cards significantly for them to communicate.

In order to overcome these drawbacks, a choice can be made to combine the two programmer and motor control functions on one and the same electronic card, which can, because in this case only one card is used instead of two, be a way of reducing the corresponding costs and simplifying the power supply.

However, the two programmer and motor control functions cannot be referenced to the sane potentials. In practice, the electronic programmer card is normally referenced to the neutral potential to be able to control the load control triacs, whereas the motor control card is placed after a rectifying diode bridge and is therefore referenced to the neutral potential but also to the phase, alternately.

To make these two programmer and motor control functions communicate, it is therefore necessary to electrically insulate the communication. There is also a need for a microcontroller for each of these two functions and referenced to the reference of the function. More particularly, the programmer microcontroller must be referenced to the neutral potential, whereas the motor control microcontroller is referenced to the "zero" potential of the rectifying diode bridge, each microcontroller having a separate power supply.

In order to overcome these constraints, it has already been proposed to move the optical communication insulation, so that the two functions are referenced to the same potential.

Based on this principle, a known solution consists in referencing these two functions to the neutral potential. In this case, it is necessary to place the optical insulation in the power part of the motor control function. However, the optical insulation is more restrictive when it comes to the motor control power, because the frequencies of the signals are high (from 16 to 24 kHz) and the delays induced by the insulation must be low. This is why the components capable of providing this function are expensive. Furthermore, given that the control power part of the motor is insulated from the microcontroller, the latter cannot directly perform, on the control power part of the motor, the current or voltage measurements necessary for the control function. This solution is therefore costly and is not suitable for all motor control contexts.

SUMMARY

The present invention aims to overcome these drawbacks by proposing a simple and cost-effective solution based on the general principle of shifting the optical communication insulation, so that the two functions are referenced to the same potential.

To this end, the main subject of the invention is a controller for three-phase asynchronous electric motor or for chopper for universal motor, comprising power units such as triacs or relays, for controlling loads, characterized in that the power units other than the relays are controlled via an insulation means, by at least one microcontroller acting as electronic programmer and, via a control, the motor control function, said microcontroller being referenced to the "zero" potential of a rectification and filtering block supplying power to the motor.

Thus, the inventive idea is to shift the optical insulation of the "programmer-motor control" communication to the load control triacs, and to reference the two functions to the "zero" potential of the diode bridge of the rectification block.

The insulation means can be an optical means of the optotriac or optocoupler type, or even an electromagnetic means of the relay or transformer type. In the case of the optocouplers, it is essential to provide an insulated power supply for the triac control power.

The low voltage power needed for the microcontrollers can be supplied by one and the same power supply.

The microcontroller power supply can thus be very simple and also power a user interface card.

Overall, the solution provided by the present invention proposes a simple and cost-effective device for controlling motors, in particular three-phase asynchronous motors, which represents a considerable asset in an industrial and commercial context where there is a need for rapid adaptation to new requirements.

BRIEF DESCRIPTION OF THE DRAWINGS

The invention will be better understood from the description that follows, given with reference to the appended schematic diagram representing, by way of example, one embodiment of this electric motor controller.

DETAILED DESCRIPTION OF EMBODIMENTS

Figure 1:
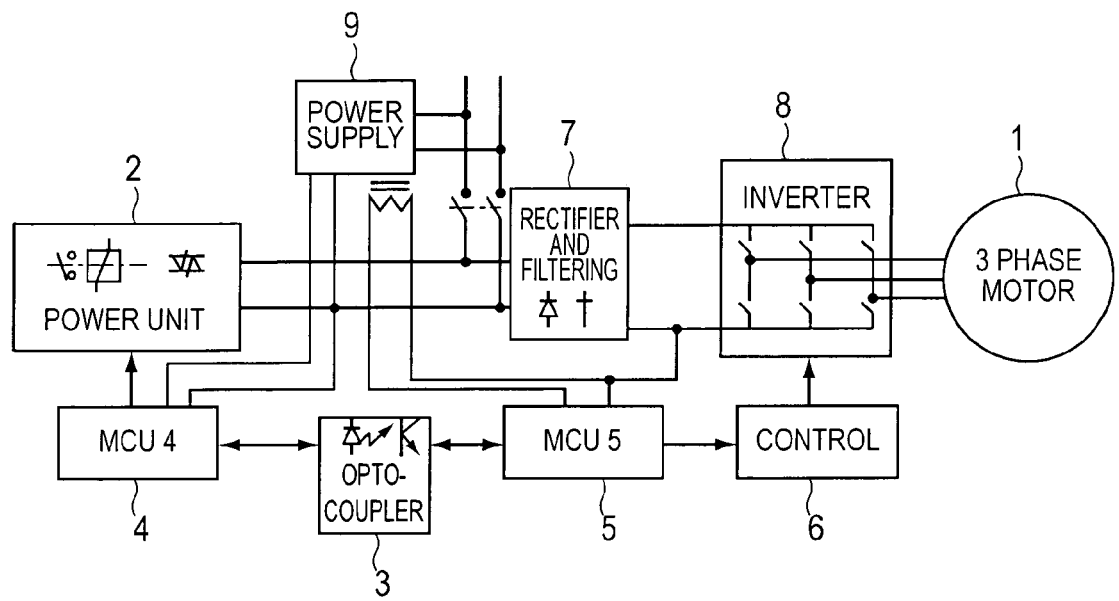
FIG. 1 is a block diagram of a current solution, with electrical insulation at communication level.

FIG. 1 illustrates the state of the art explained above. It represents a three-phase asynchronous electric motor 1 and its controller, and power units 2, such as triacs or relays, for load control. The power units 2 are controlled by a first microcontroller 4 forming an electronic programmer. A second microcontroller 5 handles control of the motor 1 via a control 6. A low voltage power supply 9 powers the first microcontroller 4, the second microcontroller 5 being powered by a separate power supply.

Optocouplers 3 in this case insulate the communication between the first microcontroller 4 referenced to the neutral potential and the second microcontroller 5 referenced to the "zero" potential of a rectification and filtering block 7 which powers the motor 1 via an inverter 8.

Figure 2:
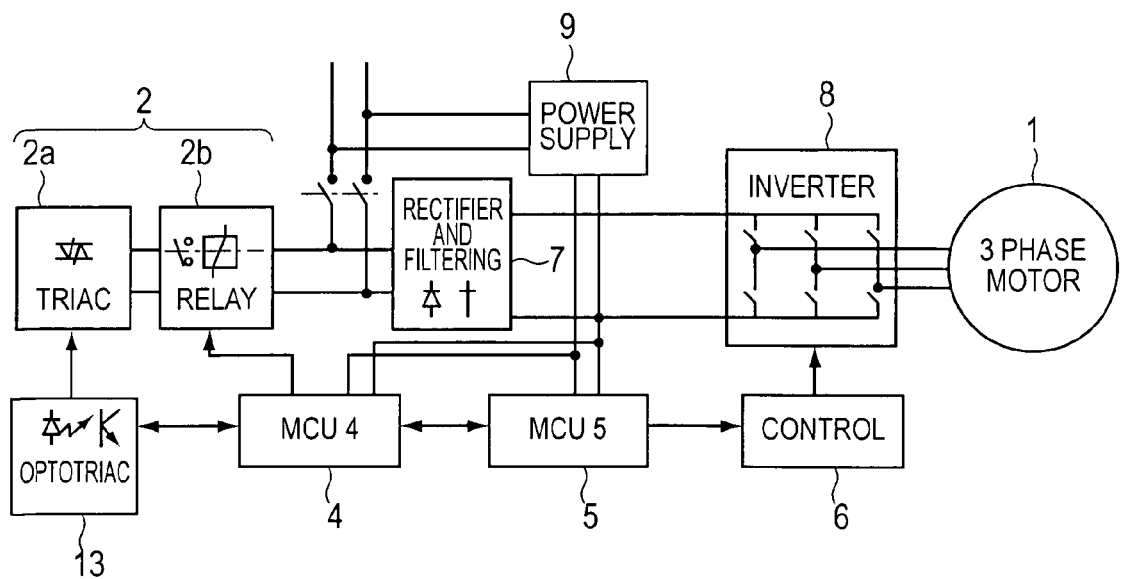
FIG. 2 is a block diagram of the solution that is the subject of the present invention, with optically insulated load control.

FIG. 2, in which the elements that correspond to those described previously are denoted by the same numeric references, indicates the principle of the solution proposed by the present invention.

This figure again represents a three-phase asynchronous electric motor 1, and its controller, and power units 2, such as triacs 2a or relays 2b, for load control. Among these power units 2, the triacs 2a are controlled by the first microcontroller 4, constituting an electronic programmer, via an optotriac 13; the relays 2b, insulated by themselves, are directly controlled by the first microcontroller 4. A second microcontroller 5 controls the motor 1 via a control 6.

The two microcontrollers 4 and 5 are referenced to the "zero" potential of a rectification and filtering block 7 which powers the motor 1 via an inverter 8.

The low voltage power needed for the two microcontrollers 4 and 5 is supplied by one and the same low voltage power supply 9, which also powers a user interface card (not shown).

Figure 3:
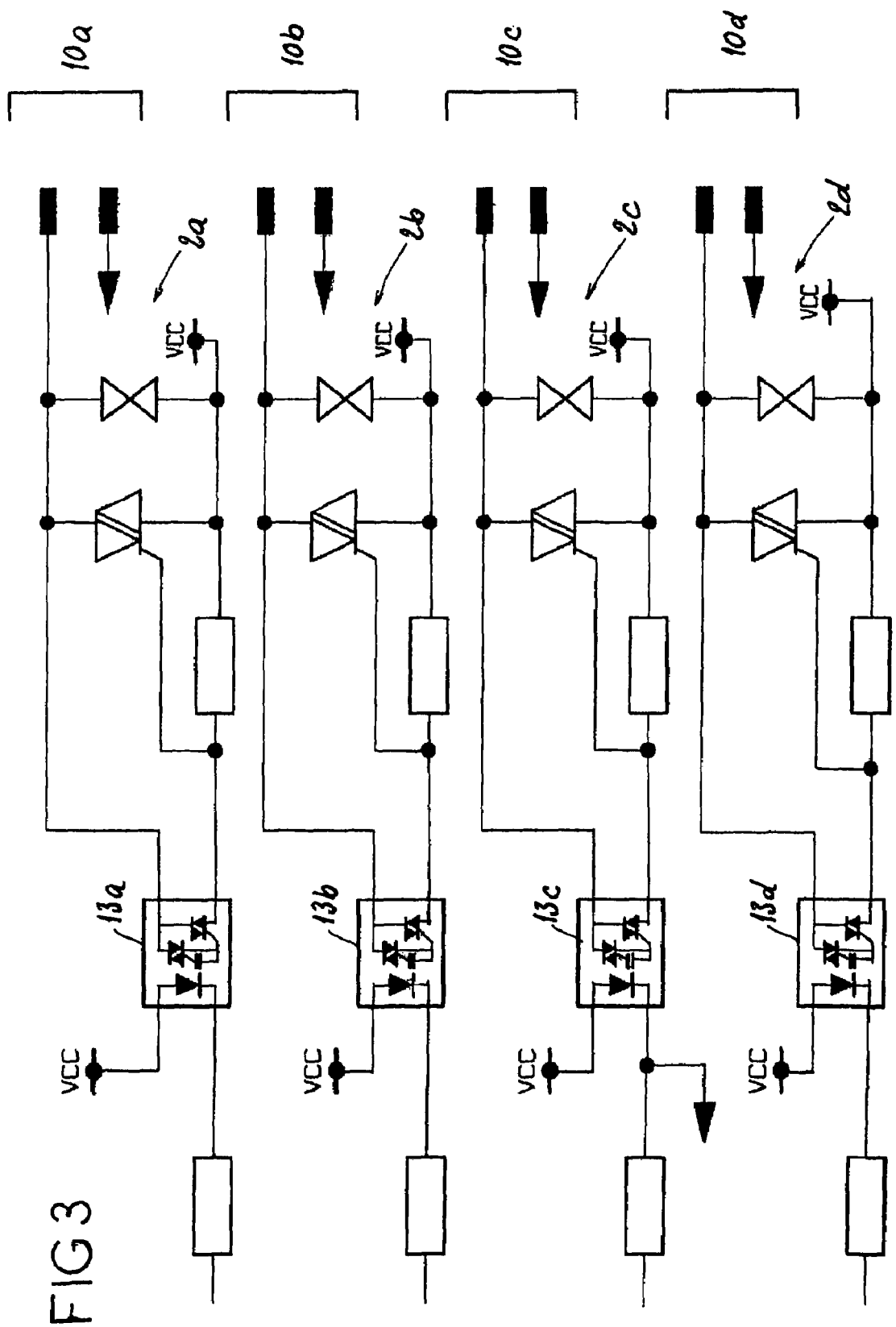
FIG. 3 is a partial schematic view of an exemplary embodiment of the invention applied to a washing machine.

FIG. 3 is a partial diagrammatic view of an exemplary embodiment applied to a washing machine, to control an electric motor 1 driving the drum of this washing machine rotation-wise.

This figure represents four load control assemblies 2a, 2b, 2c and 2d made up of triacs, for the hot water 10a and cold water 10b solenoid valves, a drain pump 10c and a product dispenser 10d. Each load control assembly is insulated by an optotriac 13a, 13b, 13c, 13d.

It should be noted that, in the case of low loads, in the order of 100 mA, it is possible to use the optotriac 13a, 13b, 13c, 13d on its own to directly control the corresponding load.

The more sophisticated the washing machine is, the greater the number there are of triacs, for example for the drain pump, the recirculation pump, for the prewash, wash solenoid valves, for the door interlock, and so on, which means that the cost overhead due to the optical insulation is a function only of the required options and will be proportional to the range level of the machine.

There will be no departure from the framework of the invention, as defined in the appended claims:

by combining the motor and programmer control functions on a single microcontroller;

by using all types of electronic components to produce the functions of the device;

by applying the device to the programmed control of electric motors of all types, in particular for a universal motor chopper;

by designing the device for other domestic electrical appliances with electric motors, such as dishwashers, tumble driers, refrigerators, freezers, etc.

What is claimed is:

1. A controller for three-phase asynchronous electric motor or for chopper for universal motor, for domestic electrical appliances, comprising power units including relays, for controlling loads, wherein:

the power units other than the relays are controlled via an insulation means, by at least one microcontroller acting as an electronic programmer, and, the at least one microcontroller performs a motor control function via a control, and said at least one microcontroller is referenced to the "zero" potential of a rectification and filtering block supplying power to the motor.

2. The controller as claimed in claim 1, wherein the insulation means is an optical means of the optotriac or optocoupler type.

3. The controller as claimed in claim 1, wherein the insulation means is an electromagnetic means, of the relay or transformer type.

4. The controller as claimed in claim 1, wherein the low voltage power required for the microcontrollers is supplied by a same power supply.

5. The controller as claimed in claim 4, wherein the low voltage power supply for the microcontrollers also powers a user interface card.

6. The use of the controller as claimed in claim 1, in a washing machine, for controlling an electric motor driving the drum of this washing machine rotation-wise.

7. The controller as claimed in claim 1, wherein the at least one microcontroller is a single microcontroller.

8. The controller as claimed in claim 1, wherein the at least one controller includes a first microcontroller for controlling the power units other than the relays and a second microcontroller for performing the motor control function, the first and second microcontrollers are different, and communication between the first and second microcontrollers is not electrically insulated.

9. The controller as claimed in claim 1, wherein the power units other than the relays include triacs.

10. The controller as claimed in claim 1, wherein the power units do not power the at least one microcontroller.

11. The controller as claimed in claim 4, wherein the power supply is not one of the power units.

* * * * *